US006551880B1

United States Patent
Lai et al.

(10) Patent No.: US 6,551,880 B1
(45) Date of Patent: Apr. 22, 2003

(54) METHOD OF UTILIZING FABRICATION PROCESS OF FLOATING GATE SPACER TO BUILD TWIN-BIT MONOS/SONOS MEMORY

(75) Inventors: Erh-Kun Lai, Taichung (TW); Chien-Hung Liu, Taipei (TW); Shou Wei Huang, Keelung (TW); Shyi-Shuh Pan, Kaohsiung (TW); Ying Tzoo Chen, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/146,876

(22) Filed: May 17, 2002

(51) Int. Cl.⁷ .......................................... H01L 21/8247

(52) U.S. Cl. .................. 438/261; 438/262; 438/287; 438/595

(58) Field of Search ................... 438/216, 261, 438/262, 263, 282, 287, 526, 591, 595, 954, 957, FOR 431

(56) References Cited

U.S. PATENT DOCUMENTS

| | | | |
|---|---|---|---|
| 6,388,293 B1 | * | 5/2002 | Ogura et al. ............. 257/324 |
| 6,432,773 B1 | * | 8/2002 | Gerber et al. ............ 438/261 |
| 6,458,642 B1 | * | 10/2002 | Yeh et al. ............... 438/261 |

* cited by examiner

Primary Examiner—Chandra Chaudhari (57) ABSTRACT

The present invention discloses a method of utilizing the fabrication process of floating gate spacer to build a twin-bit MONOS/SONOS memory, wherein recessed ONO spacers are used to fabricate a discontinuous floating gate below a poly control gate to obtain a MONOS/SONOS memory device having twinbit memory cells. Cross talk between charges stored in the two bits can be avoided, hence enhancing the reliability of memory device. Moreover, if the voltage $V_t$ varies during the fabrication process, the device can restore its normal characteristics through the individual and separate characteristic of the two bits and by using program or erase condition. The present invention can utilize the fabrication process of ONO spacer to complete the fabrication process of floating gate in automatic alignment way without the need of undergoing several mask processes.

10 Claims, 8 Drawing Sheets

METHOD OF UTILIZING FABRICATION PROCESS OF FLOATING GATE SPACER TO BUILD TWIN-BIT MONOS/SONOS MEMORY

FIELD OF THE INVENTION

The present invention relates to a fabricating method of metal oxide nitride oxide semiconductor or (MONOS) or semiconductor oxide nitride oxide semiconductor (SONOS) and, more particularly, to a method of using a discontinuous oxide nitride oxide (ONO) structure as floating gate spacers to build twin-bit MONOS/SONOS memory.

BACKGROUND OF THE INVENTION

Along with current advancement of information products, MONOS or SONOS memories tend toward high speed and compactness. For memory devices widely used in electronic products, conventional electrically erasable and programmable read only memories (EEPROMs) have the drawback of slower speed of access. However, along with progress of process technology, EEPROMs with faster speed of access, generally called flash memories, have been developed.

Basically, conventional flash memories are nonvolatile memories with floating gate transistors as the basis. In the memory cell of each flash memory, a source and a drain are formed in a semiconductor substrate, respectively. Next, an oxide, a nitride, and an oxide (an ONO structure) are formed in turn on the surface of the semiconductor substrate between the source and the drain, thereby forming a floating gate for storing charges. A control gate for controlling access of data is then formed above the ONO structure.

The state of a flash memory depends on the charge density of the floating gate, and the operation thereof depends on the technique of injecting charges into or removing charges from the floating gate. Therefore, when program data is written in, a high voltage is applied to the control gate to let hot electrons pass through the oxide from the drain and be injected into the nitride of the floating gate, hence enhancing the threshold voltage to write in data. When erasing data, it is only necessary to complete the operation of erase by means of hot hole injection to let holes enter the nitride of the floating gate and reach the same positions of the above electrons to compensate the electrons, hence achieving the object of erase.

However, in a MONOS/SONOS memory device exemplified by the above flash memory, each memory unit can only store a bit. Or each memory unit can store two bits, but there is cross talk between charges stored in these two bits, hence reducing the reliability of device. Moreover, in the prior art continuous structure, if electrons are trapped in the channel, it is difficult for two ends of the channel to restore its normal characteristics, thus failing the device. Therefore, to resolve the problems in the prior art, the present invention provides a fabricating method of a twin-bit MONOS/SONOS memory. Discontinuous ONO control gate spacers are fabricated below a control gate to build a twin-bit MONOS/SONOS memory to avoid cross talk between stored charges and to enhance the reliability of device. Furthermore, if the voltage $V_t$ varies during the fabrication process (e.g., when electrons are trapped in a silicon nitride (SiN)), the device can restore its normal characteristics through the individual and separate characteristic of the two bits and by using program or erase condition.

SUMMARY OF THE INVENTION

The primary object of the present invention is to provide a fabricating method of memory device, wherein the fabrication process of ONO floating gate spacer is utilized to fabricate a twin-bit MONOS/SONOS memory so that a discontinuous floating gate can be built in a single MONOS/SONOS device as a twin-point type charge-storing region to double the capacity of memory, hence increasing the capacity of a memory device.

Another object of the present invention is to fabricate a MONOS/SONOS memory capable of storing two bits to avoid cross talk between charges stored in the two bits, hence enhancing the reliability of memory device. Moreover, if the voltage $V_t$ varies during the fabrication process, the device can restore its normal characteristics through the individual and separate characteristic of the two bits and by using program or erase condition, thereby resolving the problem that it is difficult for two ends of a channel to restore their normal characteristics so as to fail the device if electrons are trapped in the channel in the prior art continuous structure.

Yet another object of the present invention is to provide a fabricating method of twin-bit memories, wherein the fabrication process of ONO floating gate spacer is utilized to complete the fabrication process of floating gate in automatic alignment way without the need of undergoing several mask processes, hence saving the prior art lithography process and resolving its problem of misalignment.

According to the present invention, ion implantation is performed to a silicon substrate having a pad oxide with an already defined silicon nitride as a hard mask. An oxide is formed and its surface is planarized to remove the silicon nitride and the pad oxide. Next, an ONO film is deposited on the silicon substrate, and anisotropic etch is then performed to the ONO film to form recessed and symmetrical ONO spacers. Finally, a gate oxide is deposited and an already defined polysilicon is formed. A twin-bit MONOS/SONOS memory structure is thus formed.

The various objects and advantages of the present invention will be more readily understood from the following detailed description when read in conjunction with the appended drawings, in which:

DETAILED DESCRIPTION OF THE PREFERRED EMBODIMENTS

The present invention discloses a method of utilizing the fabrication process of discontinuous and recessed ONO floating gate spacer to build twin-bit MONOS/SONOS memories so that the memory cell of a single memory can store two bits without cross talk and the capacity of memory can be doubled, hence enhancing the reliability of MONOS/SONOS devices.

Figure 1:
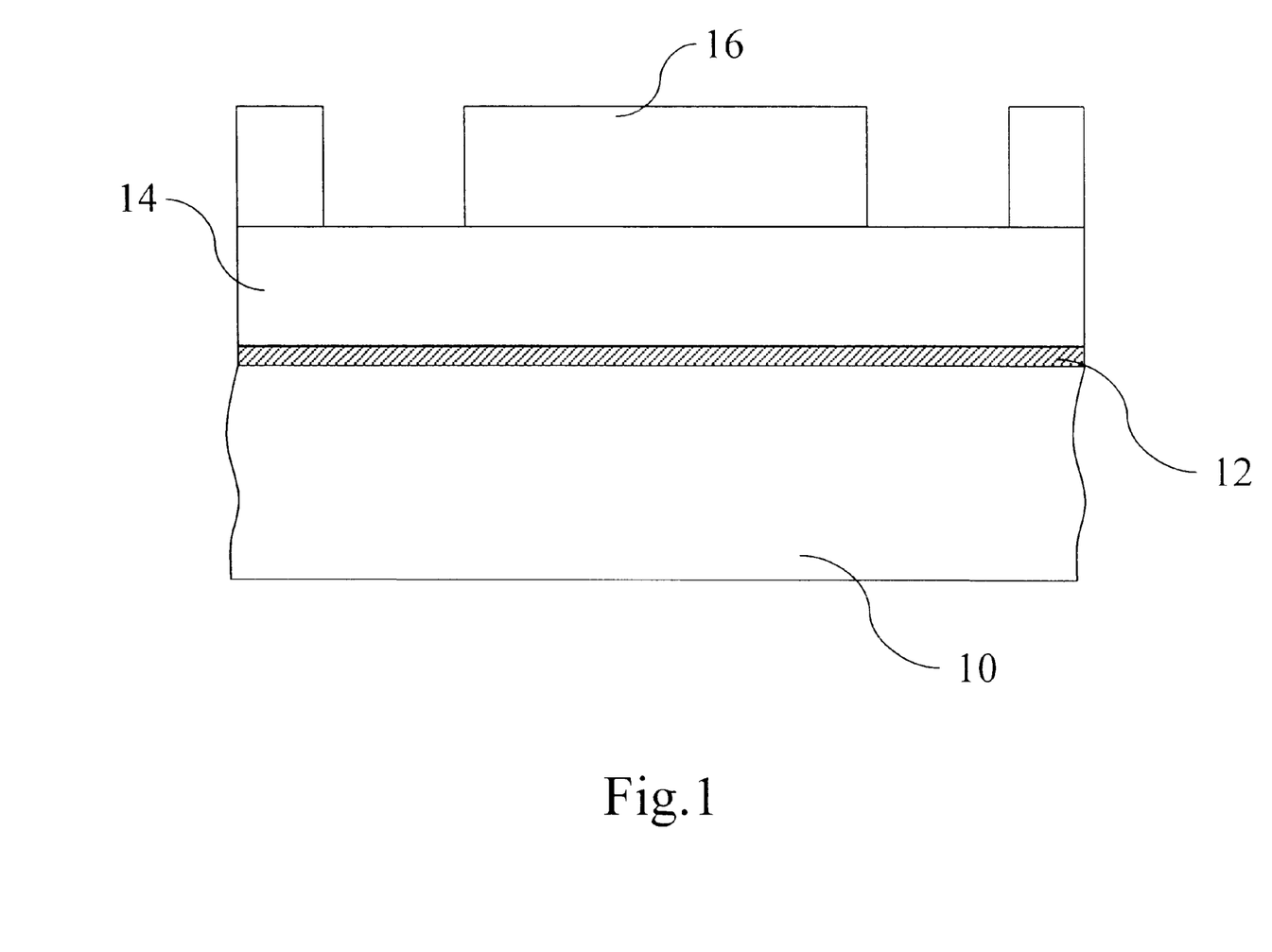
FIGS. 1 to 8 show the process flow of the fabrication process of the present invention.

Please refer to FIGS. 1 to 8. The main steps of the present invention are illustrated below. First, as shown in FIG. 1, a pad oxide 12 of silicon oxide is deposited on a semiconductor silicon substrate 10. The thickness of the pad oxide 12 is about 100 to 300 angstroms, preferably being 200 angstroms. Next, a silicon nitride (SiN) 14 is deposited above the pad oxide 12 to be used as a masking layer. The thickness of the SiN 14 is about 1500 to 2500 angstroms, preferably being 1900 angstroms. A patterned photo resist 16 is then formed on the SiN 14.

Figure 2:
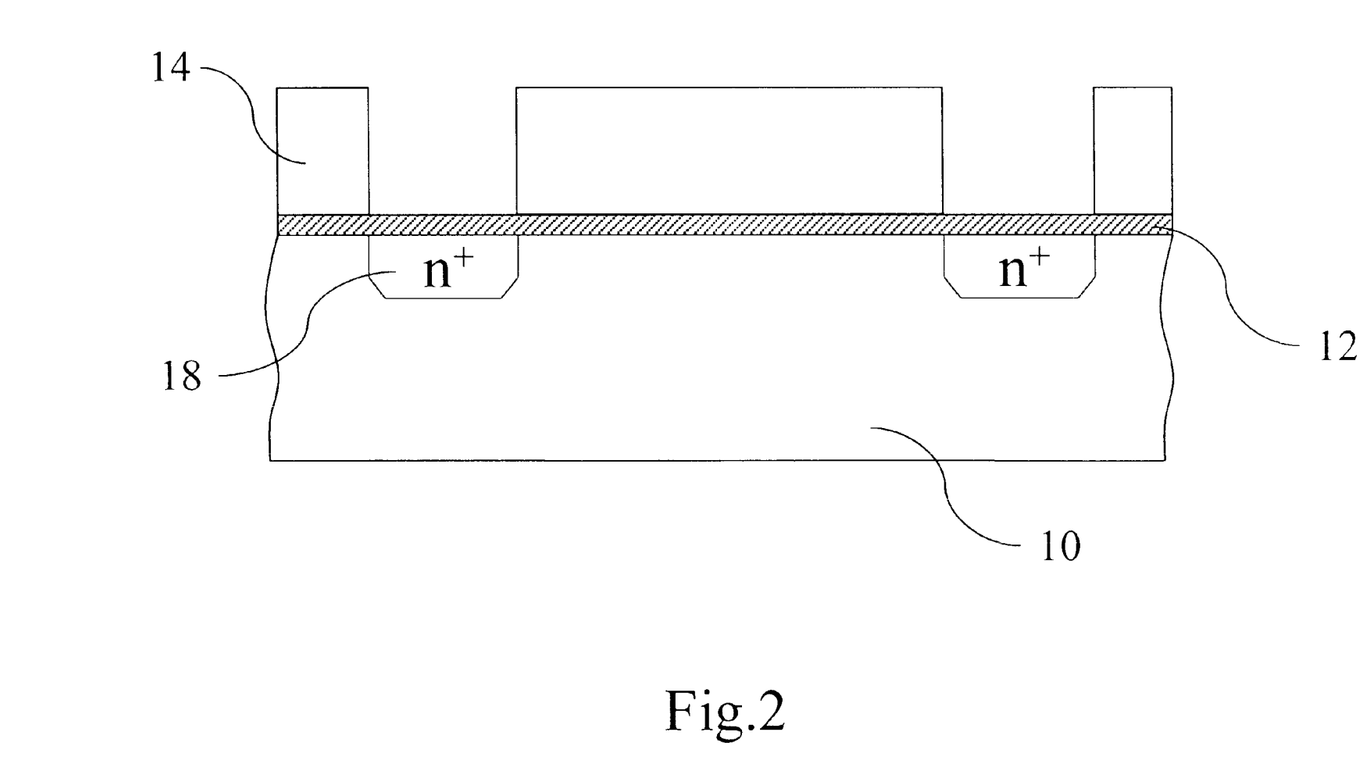
Figure 3:
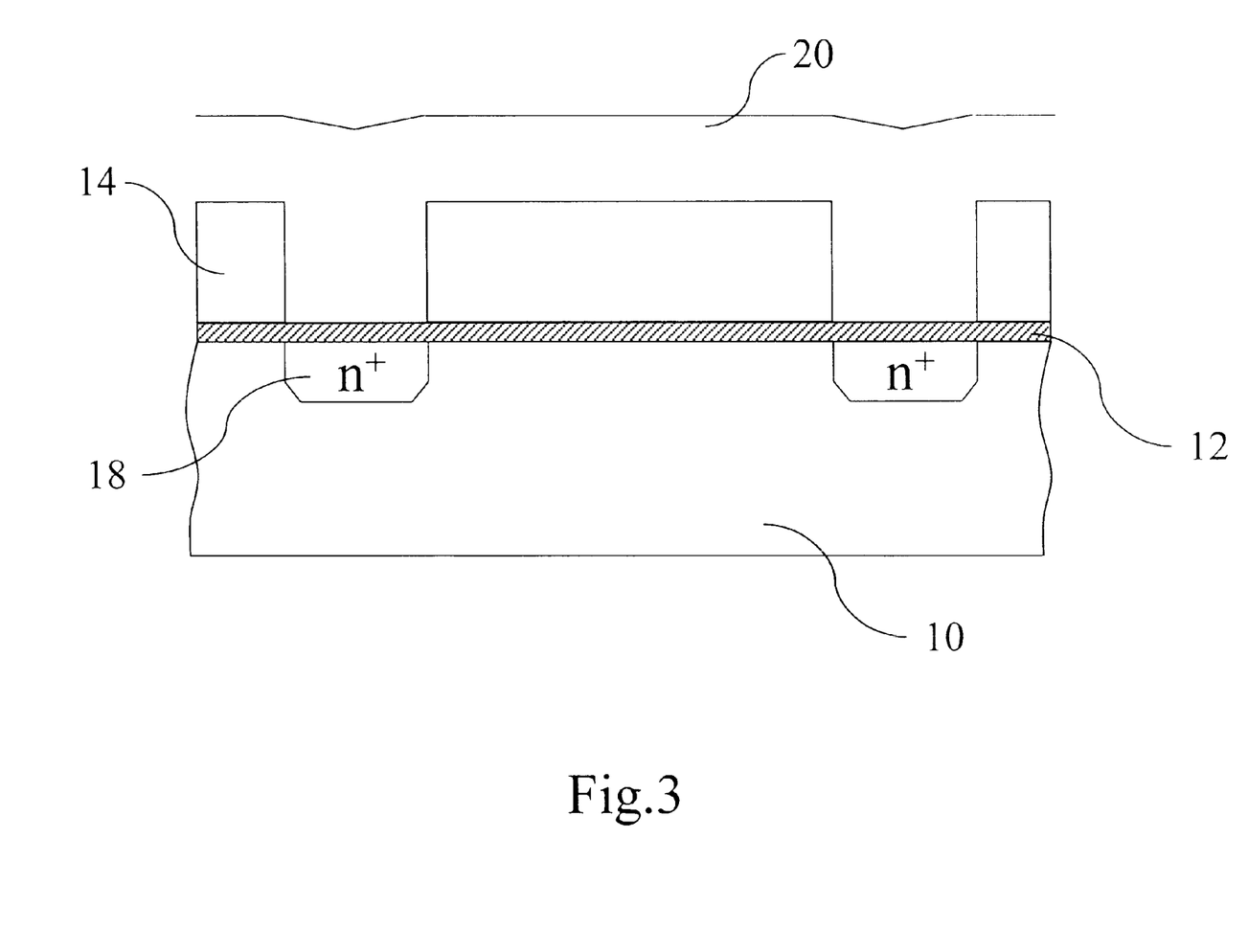

The SiN 14 is then defined with the patterned photo resist 16 as a mask by means of the conventional lithography and etch processes to form a plurality of lines of parallel SiN 14. As shown in FIG. 2, the above photo resist 16 is removed after the etch process of the SiN 14. Buried diffusion implant is then performed to the semiconductor silicon substrate 10 with the already defined SiN 14 as a hard mask so that an N-type implanted region 18 used as a source and a drain is formed in the silicon substrate 10 between adjacent SiN 14. After the above implanted region 18 is formed, as shown in FIG. 3, a buried diffusion (BD) oxide 20, generally being a silicon oxide, with a thickness of 3000 angstroms is deposited on the semiconductor silicon substrate 10 by means of high-density plasma chemical vapor deposition (HDP-CVD), plasma-enhanced chemical vapor deposition (PECVD), or low-pressure chemical vapor deposition (LPCVD). The BD oxide 20 is used to cover the surface of the SiN 14 and to fill the gap between adjacent SiN 14.

Figure 4:
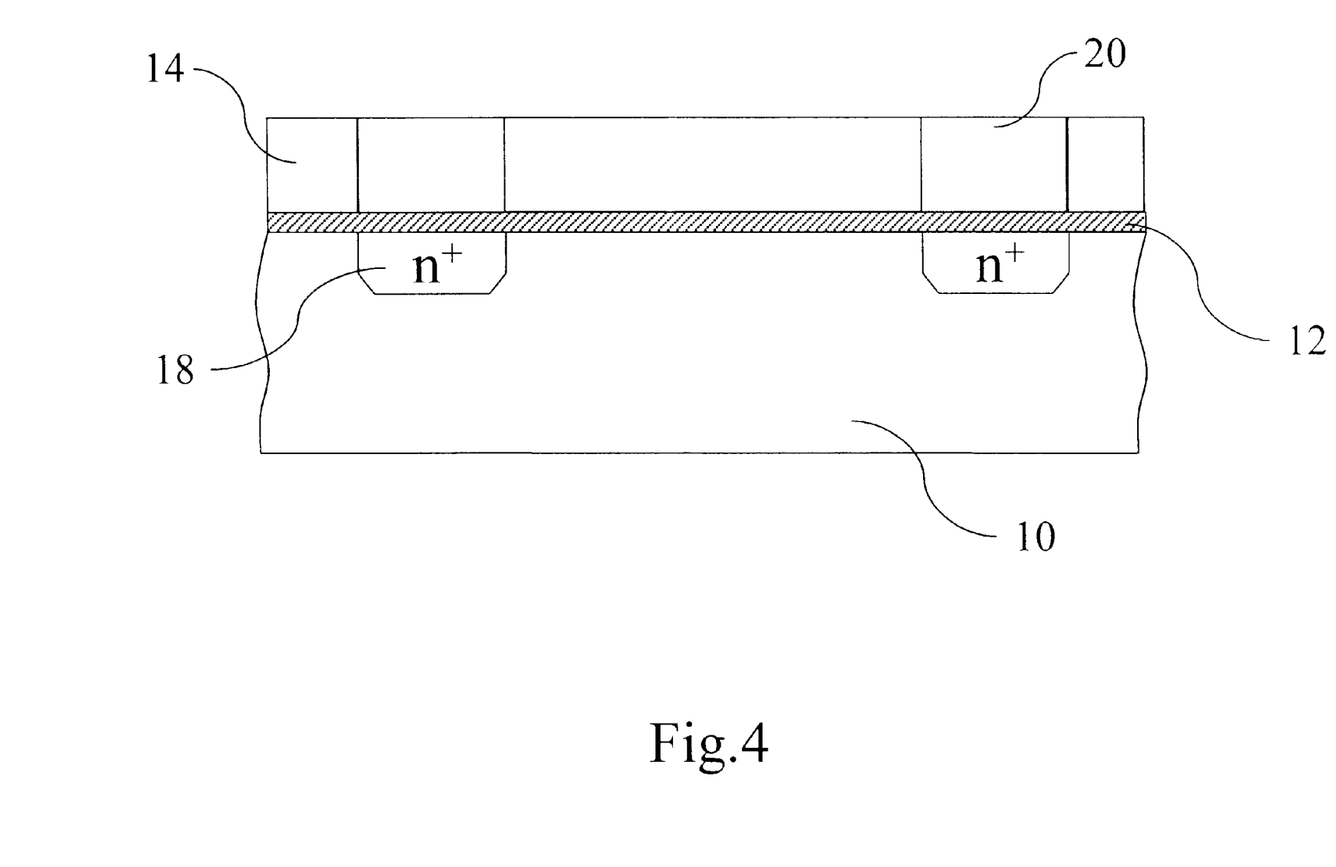

Subsequently, the oxide 20 is planarized by means of chemical mechanical polishing (CMP), as shown in FIG. 4, to remove the excess oxide 20 until the SiN 14 is exposed. The thickness of the SiN 14 after the CMP is about 1400 angstroms. The excess SiN 14 can also be removed by means of etch-back.

Figure 5:
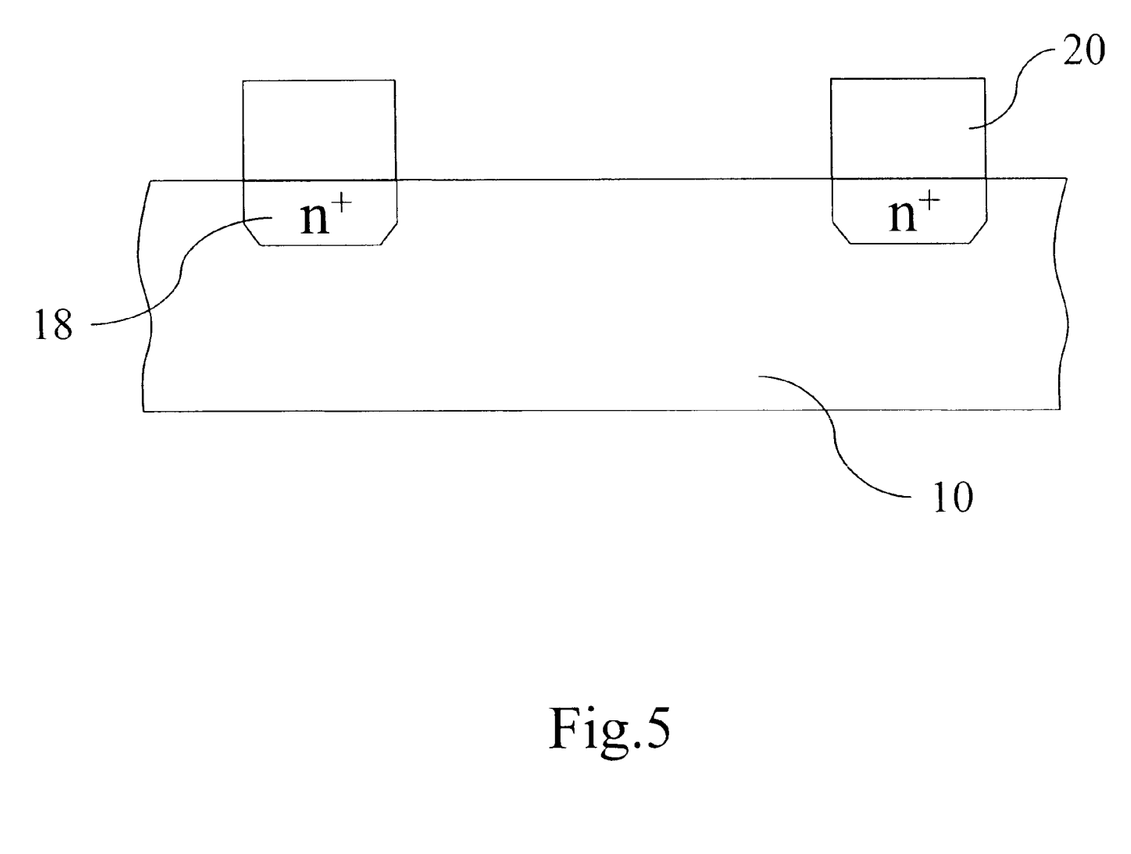

As shown in FIG. 5, after the surface of the oxide 20 is polished using the CMP, the SiN is removed, and the pad oxide 12 below the SiN 14 is simultaneously removed, hence defining the position of the floating gate device region by using the oxide 20. At this time, the thickness of the oxide 20 is about 1000 angstroms.

Figure 6:
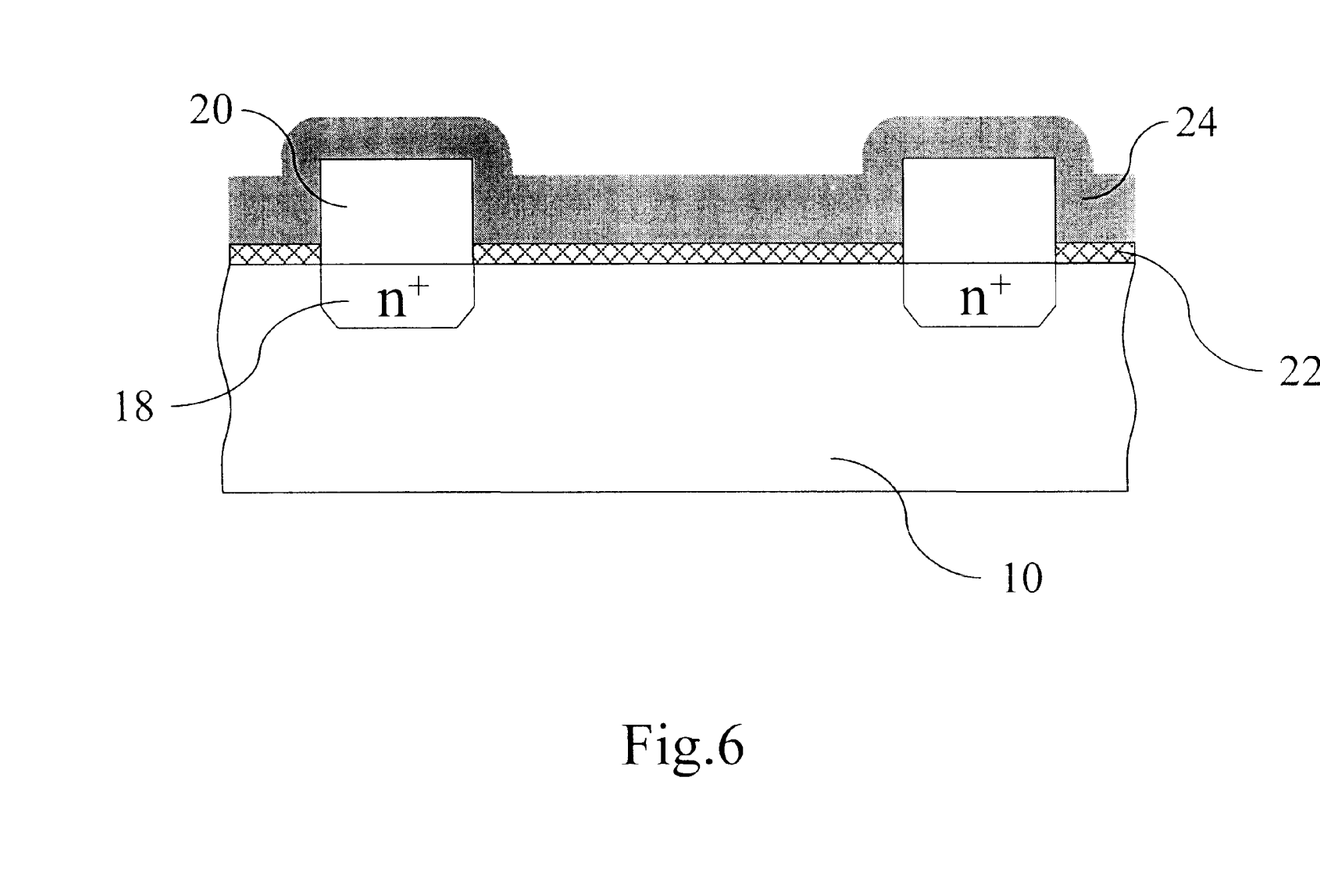

Next, after the surface of the silicon substrate 10 is cleaned, a first silicon oxide used as a bottom dielectric 22 is deposited on the surface of the silicon substrate 10 by means of CVD to cover the silicon substrate 10. A silicon nitride and a second silicon oxide 24 are then formed on the bottom dielectric 22 from bottom to top by means of CVD, as shown in FIG. 6, to cover the bottom dielectric 22 and the oxide 20. The bottom dielectric 22 and the silicon nitride and the second silicon oxide 24 together form an ONO film. The thickness of the bottom dielectric 22 is about 50 to 100 angstroms, the thickness of the silicon nitride is about 50 to 300 angstroms, and the thickness of the second silicon oxide is about 50 to 300 angstroms.

Figure 7:
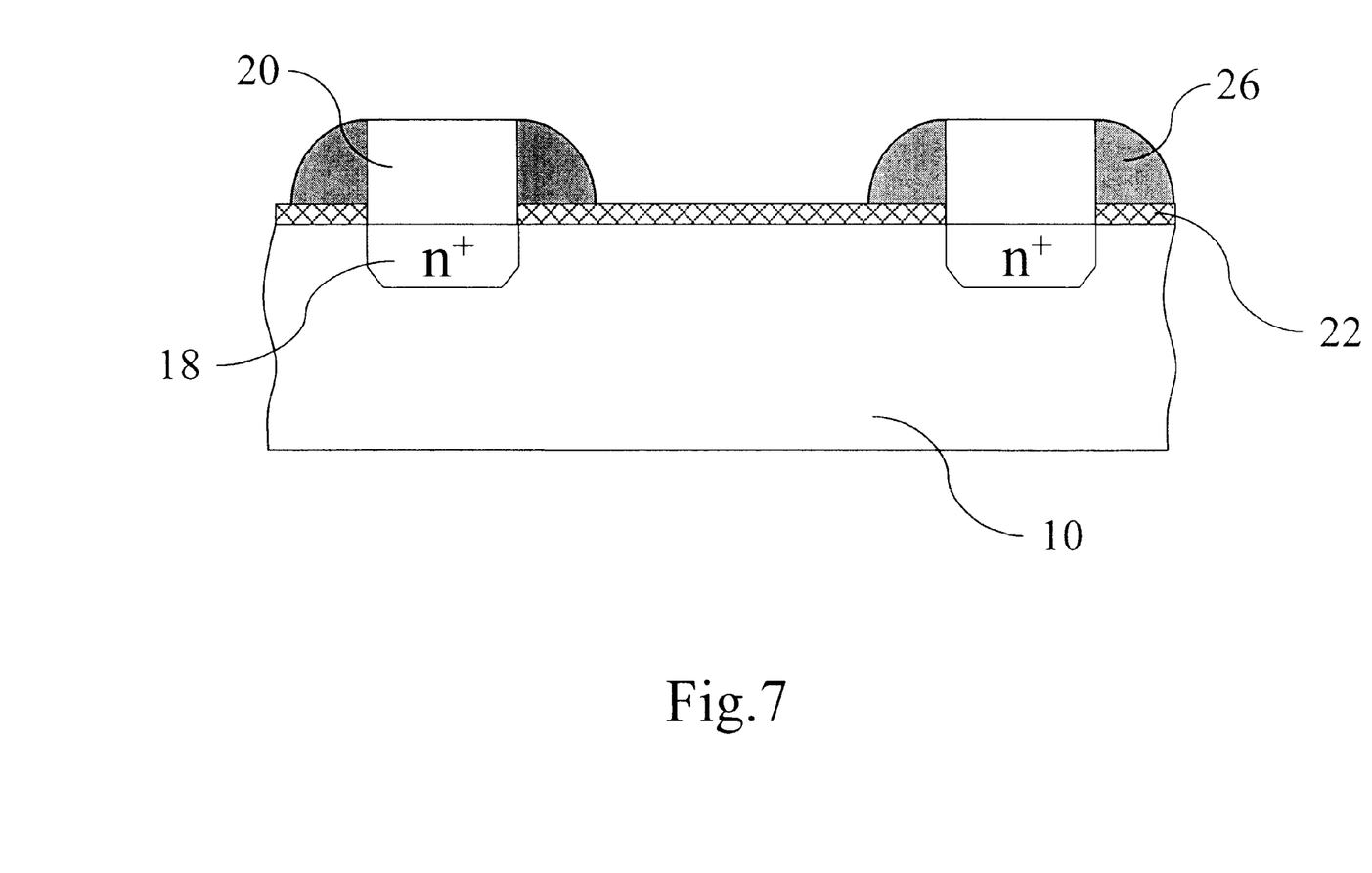

After the above steps, anisotropic etch is performed to the above ONO film 22 and 24, as shown in FIG. 7, to form recessed and symmetrical ONO spacers 26 at two sides of the oxide 20. The length of the ONO spacer 26 is about 100 to 400 angstroms. The ONO spacers 26 are used as a floating gate for storing charges. Moreover, the ONO spacers 26 as the floating gate utilize the lowermost bottom dielectric (the first silicon oxide) 22 as an oxide of F-N tunnel. The bottom dielectric 22 between the two ONO spacers 26 can be remained, or it can be removed by etching.

Figure 8:
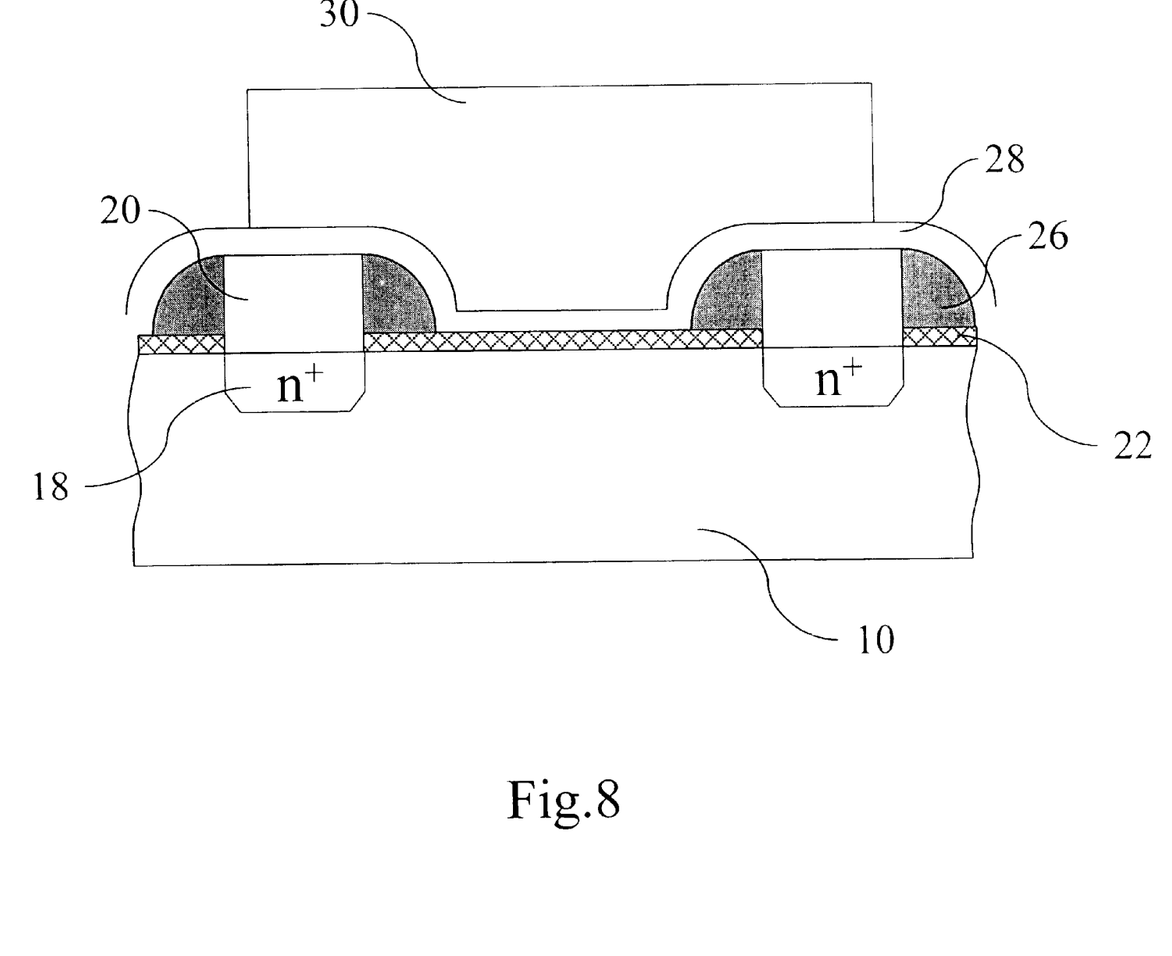

Finally, as shown in FIG. 8, a gate oxide 28 is formed on the silicon substrate 10 by means of deposition or oxidation. The thickness of the gate oxide 28 is about 20 to 100 angstroms. A polysilicon is then deposited on the gate oxide 28. The thickness of the polysilicon is about 1500 to 3000 angstroms. An already defined and patterned polysilicon 30 is formed by means of lithography and etch. The polysilicon 30 is used as a poly control gate for controlling access of data. A region without the floating gate exists in the channel between the control gate and the silicon substrate. A twin-bit MONOS/SONOS memory structure is thus formed.

To sum up, in the present invention, the fabrication process of ONO floating gate spacer is utilized to build a twin-bit MONOS/SONOS memory so that a discontinuous floating gate can be built in a single MONOS/SONOS device as a twin-point type charge-storing region to double the capacity of memory, hence increasing the capacity of a memory device. Moreover, cross talk between charges stored in the two bits can be avoided, hence enhancing the reliability of memory device. Additionally, if the voltage $V_t$ varies during the fabrication process (e.g., when electrons are trapped in the SiN), the device can restore its normal characteristics through the individual and separate characteristic of the two bits and by using program or erase condition, thereby resolving the problem that it is difficult for two ends of a channel to restore their normal characteristics so as to fail the device if electrons are trapped in the channel in the prior art continuous structure. Therefore, the present invention can complete the fabrication process of floating gate in automatic alignment way without the need of undergoing several mask processes, saving the prior art lithography process and resolving its problem of misalignment.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A method of utilizing the fabrication process of floating gate spacer to build a twin-bit MONOS/SONOS memory, comprising the steps of:
    forming a pad oxide and an already defined and patterned masking layer on a semiconductor substrate;
    performing buried diffusion implant to said substrate to form an implanted region with said masking layer as a mask;
    depositing an oxide on said substrate then planarizing said oxide to remove part of said oxide until said masking layer is exposed;
    removing said masking layer, using said oxide to define the region of device, and then removing said pad oxide;
    depositing an ONO film formed of a first oxide, a nitride, and a second oxide on the surface of said substrate to cover said oxide;
    performing anisotropic etch to said ONO film to form ONO spacers at two sides of said oxide; and
    forming an already defined polysilicon on said substrate.

2. The method as claimed in claim 1, wherein said pad oxide is a silicon oxide.

3. The method as claimed in claim 1, wherein said masking layer is a silicon nitride.

4. The method as claimed in claim 1, wherein said masking layer is formed of a patterned photo resist.

5. The method as claimed in claim 1, wherein said implanted region is an N-type implanted region.

6. The method as claimed in claim 1, wherein said oxide is a silicon oxide.

7. The method as claimed in claim 1, wherein said first oxide and said second oxide are composed of silicon oxide.

8. The method as claimed in claim 1, wherein said nitride is composed of silicon nitride.

9. The method as claimed in claim 1, wherein a gate oxide can further be deposited on said substrate before forming said polysilicon.

10. The method as claimed in claim 9, wherein said gate oxide is composed of silicon oxide.

* * * * *